(12) United States Patent
Dietz et al.

(10) Patent No.: US 7,812,063 B2
(45) Date of Patent: Oct. 12, 2010

(54) FLAME-RETARDANT RESIN FORMULATION AND ITS USE

(75) Inventors: Mathias Dietz, Simmervath (DE); Harald Bauer, Kerpen (DE); Werner Krause, Huerth (DE)

(73) Assignee: Clariant Finance (BVI) Limited, Tortola (VG)

( * ) Notice: Subject to any disclaimer, the term of this patent is extended or adjusted under 35 U.S.C. 154(b) by 0 days.

(21) Appl. No.: 12/008,602

(22) Filed: Jan. 11, 2008

(65) Prior Publication Data

US 2008/0171800 A1    Jul. 17, 2008

(30) Foreign Application Priority Data

Jan. 12, 2007    (DE)    ........................ 10 2007 001 862

(51) Int. Cl.
*C08F 2/50* (2006.01)
*C08J 7/18* (2006.01)
*C08J 7/04* (2006.01)
*C09K 21/00* (2006.01)

(52) U.S. Cl. ............................ 522/39; 522/82; 522/65; 522/92; 427/517; 427/512; 252/609

(58) Field of Classification Search ............. 522/71–82, 522/65, 92, 39; 252/609; 427/512, 517
See application file for complete search history.

(56) References Cited

U.S. PATENT DOCUMENTS

| | | | |
|---|---|---|---|
| 5,013,768 A | 5/1991 | Kiriyama et al. | |
| 5,284,736 A * | 2/1994 | Kushi et al. | 430/283.1 |
| 5,326,805 A | 7/1994 | Sicken et al. | |
| 6,420,459 B1 | 7/2002 | Horold | |
| 6,548,627 B1 * | 4/2003 | Horold | 528/398 |
| 7,332,534 B2 | 2/2008 | Knop et al. | |
| 2003/0003398 A1* | 1/2003 | Tamura et al. | 430/280.1 |
| 2006/0020064 A1* | 1/2006 | Bauer et al. | 524/115 |
| 2007/0028805 A1* | 2/2007 | Craciun et al. | 106/436 |

FOREIGN PATENT DOCUMENTS

| | | |
|---|---|---|
| EP | 0584567 | 3/1994 |
| EP | 1024168 | 8/2000 |
| WO | WO 2006/106892 | 10/2006 |

* cited by examiner

*Primary Examiner*—Mark Eashoo
*Assistant Examiner*—Jessica Paul
(74) *Attorney, Agent, or Firm*—Anthony A. Bisulca

(57) ABSTRACT

The invention relates to a flame-retardant resin formulation comprising respectively at least one flame-retardant component, one alkali-soluble component, one polymerizable monomer, one photoinitiator, and one epoxy component, which comprises, as flame-retardant component, a phosphinic salt of the formula (I),

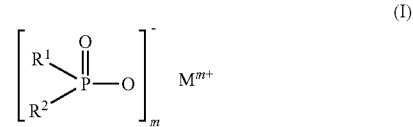

in which
$R^1$ and $R^2$ are identical or different and, independently of one another, are $C_1$-$C_6$-alkyl, linear or branched, and/or aryl;
M is Mg, Ca, Al, Sb, Sn, Ge, Ti, Zn, Fe, Zr, Ce, Bi, Sr, Mn, Li, Na, K, and/or a protonated nitrogen base, and m is from 1 to 4.

This novel flame-retardant resin formulation is preferably used as solder resist.

11 Claims, No Drawings

FLAME-RETARDANT RESIN FORMULATION AND ITS USE

The present invention is described in the German priority application No. 10 2007 001 862.4, filed Jan. 12, 2007, which is hereby incorporated by reference as is fully disclosed herein.

The invention relates to a novel flame-retardant resin formulation and to its use.

Production of printed circuits uses a thin insulating and protective layer to protect the conductive traces from external effects. During the subsequent soldering process, these layers serve as solder resist masks, since they prevent undesired contact with the solder.

Solder resists can be divided generally into two groups which can be characterized via the application process. Application usually takes place either by screenprinting or via photographic processes. In conventional screen printing resists, the print uses a screen template to generate the image of the conductors. In the case of photo-structurable solder resists, in contrast, the printed circuit board is first full-surface coated, for example by the curtain coating process or by other familiar spray processes. The image of the conductors is generated subsequently in an irradiation and development process.

Another feature in which solder resists differ is their constitution and the resin system used. Among the various types of solder resists are inter alia:
- UV-curing solder resists
- thermally curing solder resists
- photo-structurable solder resists
- solder resists for flexible circuits Solder resists are exposed to extreme conditions and therefore have to have the following property profile:
- good stability in a soldering bath
- very good adhesion
- very good stability with respect to solvents and cleaning compositions
- stability with respect to moisture, and high electrical insulation resistance
- non-combustibility Conventional methods for rendering a solder resist flame-retardant use halogenated flame retardants. Examples among these are brominated epoxy resins. A familiar flame retardant for rendering epoxy resins flame-retardant is tetrabromobisphenol A. This can be incorporated directly into the epoxy resin. Antimony trioxide is moreover used as additional flame retardant auxiliary.

Examples of flame retardants that can be used for light-sensitive solder resists are bromine-containing methacrylates, e.g. 2,4,6-tribromophenol methacrylate, tetrabromobisphenol A monomethacrylate, and tetrabromobisphenol A dimethacrylate.

However, a disadvantage of brominated flame retardants is that they impair flexibility. In addition, some compounds are suspected of forming carcinogenic dioxins during incineration.

Antimony trioxide indeed catalyzes the formation of dioxines. Antimony trioxide dusts can moreover be absorbed through the respiratory tracts. Experiments on animals have clearly demonstrated that these dusts are carcinogenic. In addition, both the preparation process and the disposal process are attended by health hazards for the workers involved. Antimony trioxide dusts can pass into the environment by way of the smoke from waste incineration.

The general increase in requirement for materials which are environmentally compatible and whose disposal poses no risks has led to a search for alternatives, especially for the brominated flame retardants. The alternatives have to be bromine-free or halogen-free, in order to satisfy these demands.

One of the alternatives investigated were phosphoric esters. However, flame-retardant action is very small and relative large amounts of phosphoric ester are therefore needed to achieve a flame-retardant effect. A disadvantageous effect of the large amount of phosphoric ester added is exudation on the surface of the hardened film.

Other alternatives exhibited poor solubilities in the organic solvents usually used, or were not stable in the Pressure Cooker Test (PCT) (WO2006/106892). There is therefore a need to improve the properties of the flame-retardant solder resists known hitherto.

It is therefore an object of the present invention to provide a solder resist which has not only very good flame retardancy and flexibility but also high stability with respect to soldering baths and with respect to moisture, and also has stability with respect to temperature.

The present invention therefore provides a flame-retardant resin formulation, comprising respectively at least one flame-retardant component, one alkali-soluble component, one polymerizable monomer, one photoinitiator, and one epoxy component, which comprises, as flame-retardant component, a phosphinic salt of the formula (I)

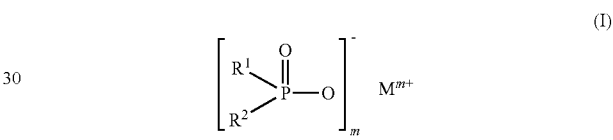

in which
$R^1$ and $R^2$ are identical or different and, independently of one another, are $C_1$-$C_6$-alkyl, linear or branched, and/or aryl;
M is Mg, Ca, Al, Sb, Sn, Ge, Ti, Zn, Fe, Zr, Ce, Bi, Sr, Mn, Li, Na, K, and/or a protonated nitrogen base, and m is from 1 to 4.

It is preferable that $R^1$ and $R^2$, identical or different, are, in each case independently of one another, methyl, ethyl, n-propyl, isopropyl, n-butyl, tert-butyl, n-pentyl, and/or phenyl.

It is preferable that the phosphinic salt of the formula (I) is the aluminum salt of diethylphosphinic acid.

It is preferable that the median particle size ($d_{50}$) of the aluminum salt of diethylphosphinic acid is from 0.1 to 100 μm, preferably from 1 to 20 μm.

It is preferable that the alkali-soluble component is a modified epoxy acrylate.

It is preferable that the polymerizable monomer is polyfunctional acrylates of polyhydric alcohols.

It is preferable that the polyhydric alcohols are pentaerythritol and/or dipentaerythritol.

It is preferable that the photoinitiator is alpha-aminoacetophenones.

It is preferable that the compound here is (4-methylthiobenzoyl)-1-methyl-1-morpholinoethane.

It is preferable that the epoxy compound is an epoxidized novolak.

It is preferable that the flame-retardant resin formulation comprises at least
from 0.1 to 50% by weight of flame-retardant component,
from 0.1 to 65% by weight of alkali-soluble component,
from 0.1 to 65% by weight of polymerizable monomer,
from 0.1 to 15% by weight of photoinitiator, and
from 0.1 to 25% by weight of epoxy component.

It is particular preferable that the flame-retardant resin formulation comprises at least
from 5 to 20% by weight of flame-retardant component,
from 30 to 40% by weight of alkali-soluble component,
from 5 to 10% by weight of polymerizable monomer,
from 4 to 5% by weight of photoinitiator, and
from 5 to 10% by weight of epoxy component.

It is preferable that the flame-retardant resin formulation moreover comprises from 0.1 to 30% by weight, particularly from 1 to 20% by weight, of at least one synergistic flame-retardant component, which is melamine, melamine derivatives of cyanuric acid, melamine derivatives of isocyanuric acid, melamine salts, such as melamine phosphate, melamine polyphosphate, or melamine diphosphate, dicyandiamide, or a guanidine compound, such as guanidine carbonate, guanidine phosphate, guanidine sulfate, and/or condensates of ethyleneurea and formaldehyde, or ammonium polyphosphate; oxygen compounds of silicon, these being orthosalicic acid and its condensates, or being silicates, zeolites, and silicas; or aluminum hydroxide.

The invention also provides the use of the flame-retardant resin formulation as claimed in one or more of claims 1 to 11 in, or for the production of, coatings for electronics and electrical engineering.

The invention also in particular provides the use of the flame-retardant resin formulation as claimed in one or more of claims 1 to 11 as solder resist.

The invention likewise provides a process for the production of flame-retardant solder resists, which comprises using spincoating, dip coating, doctor coating, curtain coating, brushing, spraying, or reverse roll coating to apply a thin layer of a solder resist to a substrate, and then drying and irradiating the layer, developing it with an alkaline solution, and then thermally post-curing it.

The substrate is preferably a rigid or flexible printed circuit board.

It is preferable that the flexible printed circuit boards are uncoated or copper-coated plastics polymers based on polyester, polyimide, epoxy resin reinforced with aramide fibers, or Liquid Crystal Polymer (LCP).

It is preferable that the layer thickness of the solder resist is from 0.1 to 50 µm.

Salts of phosphinic acids in combination with a number of synergistic compounds have proven (EP-A-1 024 168) to be effective flame retardants for, inter alia, epoxy resins. Here, an epoxy resin composed of bisphenol A and epichlorohydrin was modified via addition of alumina trihydrate and aluminum diethylphosphinate, thus permitting achievement of UL 94 V-0 classification.

The solder resists rendered flame-retardant by the phosphinic salt have good stability with respect to soldering baths, have good adhesion on all of the conventional substrates used in the printed circuit board industry, in particular on copper, lead/tin, tin-silver-copper alloys, and on epoxy- and phenolic-resin bonded printed circuit boards. The solder resists moreover have high flexibility, and this also makes them suitable for use in a flexible printed circuit board.

M is preferably aluminum, calcium, titanium, zinc, tin, or zirconium.

Preferred dialkylphosphinic salts of the inventive flame-retardant resin formulation are aluminum trisdiethylphosphinate, aluminum trismethylethylphosphinate, titanyl bisdiethylphosphinate, titanium tetrakisdiethylphosphinate, titanyl bismethylethylphosphinate, titanium tetrakismethylethylphosphinate, zinc bisdiethylphosphinate, zinc bismethylethylphosphinate, and mixtures thereof.

It is preferable to use, for the inventive flame-retardant resin formulation, a dialkylphosphinic salt whose median particle size ($d_{50}$) is from 0.1 to 100 µm, particularly from 1 to 20 µm.

It is preferable to use a dialkylphosphinic salt with exclusively spherical particle shape, minimizing the content of particles in the form of needles in the dialkylphosphinic salt.

The dialkylphosphinic salt can preferably be used in combination with other halogen-free flame retardants for the inventive flame-retardant resin formulation.

These flame-retardant combinations preferably comprise from 0.1 to 20% by weight of at least one dialkylphosphinic salt of the formula (I) and from 0.1 to 30% by weight of a synergistic flame-retardant component.

The flame-retardant combinations particularly preferably comprise from 1 to 10% by weight of at least one dialkylphosphinic salt of the formula (I) and from 1 to 20% by weight of a synergistic flame-retardant component.

The synergistic flame-retardant component is preferably an oxygen compound of silicon, or is magnesium compounds, or is zinc compounds or aluminum compounds.

It is preferable that the oxygen compounds of silicon are salts and esters of orthosalicic acid and condensates thereof, or are silicates, zeolites, and silicas, or are glass powders, glass-ceramic powders or ceramic powders.

It is preferable that the magnesium compounds are magnesium hydroxide, hydrotalcites, magnesium carbonates, or magnesium calcium carbonates.

It is preferable that the zinc compounds are zinc oxide, zinc stannate, zinc hydroxystannate, zinc phosphate, zinc borate, or zinc sulfides.

It is preferable that the aluminum compounds are aluminum hydroxide or aluminum phosphate.

It is preferable that the synergistic flame-retardant component is nitrogen compounds and/or phosphorus-nitrogen compounds.

It is preferable that the nitrogen compounds are those of the formula (III) to (VIII), or a mixture thereof

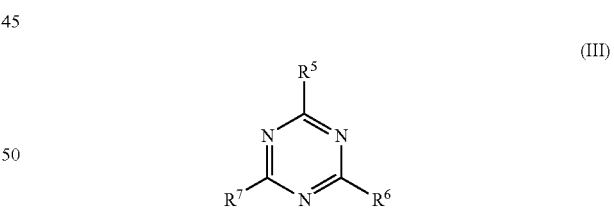

(III)

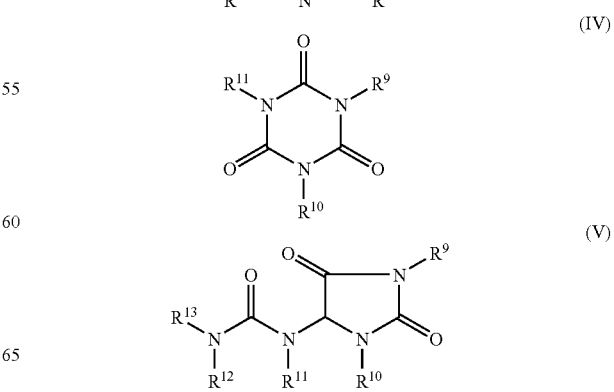

(IV)

(V)

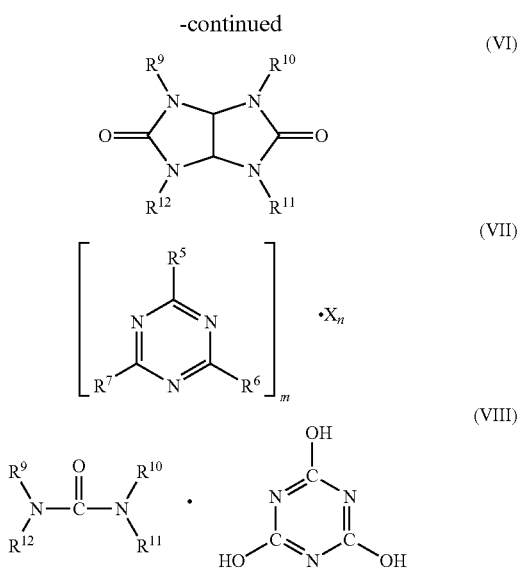

in which
R⁵ to R⁷ are hydrogen, $C_1$-$C_8$-alkyl, $C_5$-$C_{16}$-cycloalkyl or -alkylcycloalkyl, where appropriate substituted with a hydroxy function or with a $C_1$-$C_4$-hydroxyalkyl function, $C_2$-$C_8$-alkenyl, $C_1$-$C_8$-alkoxy, -acyl, -acyloxy, $C_6$-$C_{12}$-aryl or -arylalkyl, —OR⁸, and —N(R⁸)R⁹, including systems of N-alicyclic or N-aromatic type,
R⁸ is hydrogen, $C_1$-$C_8$-alkyl, $C_5$-$C_{16}$-cycloalkyl or -alkylcycloalkyl, where appropriate substituted with a hydroxy function or with a $C_1$-$C_4$-hydroxyalkyl function, $C_2$-$C_8$-alkenyl, $C_1$-$C_8$-alkoxy, -acyl, -acyloxy, or $C_6$-$C_{12}$-aryl, or -arylalkyl,
R⁹ to R¹³ are groups identical with R⁸ or else —O—R⁸,
m and n, independently of one another, are 1, 2, 3, or 4, and
X is acids which can form adducts with triazine compounds (III);

or are oligomeric esters of tris(hydroxyethyl) isocyanurate with aromatic polycarboxylic acids.

It is preferable that the nitrogen compound or the phosphorus-nitrogen compound used is melamine, melamine derivatives of cyanuric acid, melamine derivatives of isocyanuric acid, melamine salts, such as melamine phosphate, or melamine diphosphate, melamine polyphosphate, dicyandiamide, allantoin, glycolurile, or a guanidine compound, such as guanidine carbonate, guanidine phosphate, guanidine sulfate, benzoguanamine, and/or condensates of ethyleneurea and formaldehyde, and/or ammonium polyphosphate, and/or is carbodiimides.

Other compounds that can be used in addition to the above-mentioned nitrogen component or phosphorus-nitrogen component are oligomeric esters of tris(hydroxyethyl) isocyanurate with aromatic polycarboxylic acids, these being as described in EP-A-0 584 567, and nitrogen-containing phosphates of the formulae $(NH_4)_y H_{3-y} PO_4$ or $(NH_4 PO_3)z$, where y can assume numerical values from 1 to 3, and z is a number of any desired magnitude (about 1 to 10 000), typically also presented as an average value of a chain length distribution.

The alkali-soluble compound used for the inventive flame-retardant resin formulation is preferably a polymer whose molecular weight is from 10 000 to 500 000 and whose acid number is from 100 to 300 mg KOH/g. Particularly suitable compounds are acrylic polymers having free carboxylic acid functions (copolymers), and these can be obtained via copolymerization of an unsaturated carboxylic acid, e.g. methacrylic acid, acrylic acid, crotonic acid, and maleic acid, with one or more esters, e.g. of methacrylic acid, e.g. methyl methacrylate, ethyl methacrylate, propyl methacrylate, butyl methacrylate, benzyl methacrylate, 2-ethylhexyl methacrylate, hydroxyethyl methacrylate, or hydroxypropyl methacrylate, or vinyl components, e.g. styrene, methylstyrene, or vinyltoluene, or polyolefin compounds, such as butadiene, isoprene, or chloroprene, or else compounds such as vinyl acetate or methacrylonitrile.

Examples of copolymers are copolymers composed of acrylates and of methacrylates, e.g. acrylic acid or methacrylic acid, and styrene or substituted styrenes, phenolic resins, e.g. novolaks, polyhydroxystyrene, and copolymers of hydroxystyrene with alkyl acrylates, acrylic acid, and/or methacrylic acid.

Preferred copolymers are copolymers of methyl methacrylate/methacrylic acid, copolymers of benzyl methacrylate/methacrylic acid, copolymers of methyl methacrylate/ethyl acrylate/methacrylic acid, copolymers of benzyl methacrylate/methacrylic acid/hydroxyethyl methacrylate, copolymers of methyl methacrylate/butyl methacrylate/methacrylic acid/styrene, and copolymers of methyl methacrylate/benzyl methacrylate/methacrylic acid/hydroxyphenyl methacrylate.

Other compounds preferably suitable for the alkali-soluble components are polymers or oligomers which have at least two unsaturated, ethylenic double bonds, and also at least one carboxy function in their molecular structure. These compounds are obtained by way of example via reaction of a saturated or unsaturated anhydride which contains more than one reactive hydrogen atom with a reaction product composed of an epoxy component and of an unsaturated monocarboxylic acid (e.g.: EB® 9696 from UCB Chemicals; KAYARAD® TCR1025 from Nippon Kayaku Co., LTD; NK® OLIGO EA-6340, EA-7440 from Shin-Nakamura Chemical Co., LTD).

Other suitable polymerizable monomers are photopolymerizable vinyl monomers, hydroxyalkyl acrylates, e.g. 2-hydroxyethyl acrylate and 2-hydroxybutyl acrylate, mono- or diacrylates of glycols, e.g. ethylene glycol, polyethylene glycol, and propylene glycol, acrylamides, e.g. N,N-dimethylacrylamide, polyfunctional acrylates of polyhydric alcohols, or of ethylene oxide/propylene oxide adducts, e.g. hexanediol, trimethylolpropane, pentaerythritol, or dipentaerythritol, or are trishydroxyethyl isocyanurate, phenoxy acrylates, bisphenol A diacrylates, acrylates of glycidyl ethers, e.g. glycerol diglycidyl ether, or are melamine acrylates.

The polymerizable component can also be used in the form of a mixture with a non-polymerizable, film-forming component. This film-forming component is a physically drying polymer or a solution of the polymer in an organic solvent, for example nitrocellulose or cellulose acetobutyrate. These can also, however, be chemically or thermally curable resins, e.g. polyisocyanates, polyepoxides or melamine resins, or else polyimide. The concomitant use of thermally curable resins is important for the use in what are known as hybrid systems, which are photopolymerized in a first stage and are crosslinked in a second stage via thermal posttreatment.

The photoinitiator used in the inventive resin formulations can comprise any of the types of photoinitiators which form free radicals during the appropriate irradiation. Examples of a photoinitiator that is used are benzoin alkyl ether, benzophenones, benzil ketals, 4-aroyl-1,3-dioxolanes, dialkoxyacetophenones, alpha-hydroxy- or alpha-aminoacetophenones, e.g. (4-methylthiobenzoyl)-1-methyl-1-morpholinoethane, alpha-hydroxycycloalkyl phenyl ketones, mono- or bisacylphosphine oxides, and mixtures thereof.

The epoxy component is preferably a liquid or solid epoxy resin. It is preferable to use a liquid epoxy resin if high stability during metallization is demanded. For better stability with respect to water, in contrast, preference is given to an epoxy resin which has a large number of methyl groups or benzene rings.

Preferred epoxy resins are resins of the bisphenol S type, e.g. BPS®-200 from Nippon Kayaku Co., Ltd, EPX®-30 from ACR Co., Epiculon® EXA-1514 from Dainippon Ink & Chemicals Inc, or bisphenol A resins such as Epiclon® N-3050, N-7050, N-9050 from Dainippon Ink & Chemicals., XAC® 5005, GT® 7004, 6484T, 6099 from Huntsman; Bisphenol F resins such as YDF® 2004, YDF® 2007 from Tohto Kasei Co., heterocyclic epoxy resins such as TEPIC® from Nissan Chemical Industries, Ltd., Araldite® PT 810 from Huntsman, epoxidized novolaks such as EPPN®201, EOCN® 103, EOCN® 1020, EOCN® 1025 produced by Nippon Kayaku Co., Ltd, ECN® 278, ECN® 292 und ECN® 299 from Asahi Chemical Industry Co., Ltd., GY® 1180, ECN® 1273 und ECN® 1299 from CIBA GEIGY AG, YDCN® 220L, YDCN® 220HH, YDCN® 702, YDCN® 704, YDPN® 601, and YPDN® 602 from Tohto Kasei Co., Epiclon® 673, N® 680, N® 695, N® 770, and N® 775 produced by Dainippon Ink & Chemicals Inc., amino-functional epoxy resins, such as YH® 1402 and ST® 110 from Tohto Kasei Co., YL® 931 and YL® 933 from Yuka Shell Co., rubber-modified epoxy resins, such as Epiclon® TSR-601 from Dainippon Ink & Chemicals Inc., EPX® 84-2 and EPX® 4061 from Asahi Denka Kogyo K. K., silicone-modified epoxy resins such as ®-1359 from Asahi Denka Kogyo K. K., and other epoxy resins.

Amines can be added to accelerate the photopolymerization reaction, examples being triethanolamine, N-methyldiethanolamine, ethyl p-dimethylaminobenzoate, or Michler's ketone. The action of the amines can be reinforced via addition of aromatic ketones of benzophenone type. Examples of amines that can be used as oxygen scavengers are substituted N,N-dialkylanilines, these being as described in EP-A-0 339 841.

The photopolymerization reaction can moreover be accelerated via addition of photosensitizers, which shift or widen spectral sensitivity. These are in particular aromatic carbonyl compounds, such as benzophenone derivatives, thioxanthone derivatives, anthraquinone derivatives, and 3-acylcoumarin derivatives, and also 3-(aroylmethylene)thiazolines, and also eosin dyes, rhodamine dyes, and erythrosine dyes.

The inventive resin formulations can, as a function of the planned application, and of the nature of the formulation, be used in solvent-free form, or else can comprise conventional solvents.

Examples of suitable solvents which can be used alone or in mixtures are: ketones, such as acetone, dimethyl ketone, diethyl ketone, methyl isobutyl ketone, cyclohexanone, cyclopentanone, cycloheptanone, isophorone, methoxyhexanone, acetonylacetone, acetophenone, benzyl ethyl ketone, 3,3,5-trimethylcyclohexanone, mesityl oxide; alcohols such as methanol, ethanol, propanol, butanol, hexanol, cyclohexanol, furfuryl alcohol, tetrahydrofurfuryl alcohol, benzyl alcohol, monoalkylated glycols, such as methyl glycol, ethyl glycol, triethylene glycol monoethyl ether or triethylene glycol monobutyl ether, glycols such as ethylene glycol, propylene glycol, or butylene glycol, and their oligomers, such as triethylene glycol; aliphatic and aromatic hydrocarbons, such as pentane, hexane, cyclohexane, methylcyclohexane, benzene, toluene or xylene, ethers, such as diethyl ether, dibutyl ether, tetrahydrofuran, dioxane, ethylene glycol dimethyl ether, diethylene glycol dimethyl ether, carboxylic esters, such as methyl, ethyl, propyl, butyl, and isopropyl, and phenyl acetate, methyl propionate, butyl glycolate, ethyl glycol mono- or diacetate, methyl or ethyl glycolate acetate; lactones, such as butyro- or valerolactone; amides, such as dimethylformamide, dimethylacetamide, hexamethylphosphoramide; sulfones, e.g. dimethyl sulfone, dibutyl sulfone, or tetramethylene sulfone, mixtures of hydrocarbons, e.g. petroleum ether, solvent naphtha, or hydrogenated naphtha.

The inventive resin formulations can also comprise fillers. The fillers used are to be fine-particle fluids, i.e. the particle size of the filler has to be smaller than the distance between impacters in printed circuits. The average particle size can be from 0.01 to 10 µm, preferably from 0.01 to 5 µm. Micronized fillers whose average particle size is from 0.01 to 1.5 µm are particularly preferred.

Suitable fillers are colloidal or hydrophobicized silicon dioxide, microtalc, micromica, kaolin, aluminum oxides, magnesium silicate, aluminum hydroxide, calcium silicate, aluminum silicate, magnesium carbonate, calcium carbonate, zirconium silicate, ground porcelain, antimony trioxide, titanium dioxide, barium titanate, or barium sulfate, or a mixture of the fillers mentioned.

The fillers advantageously have a coupling agent to achieve good adhesion between polymer matrix and filler. Examples of suitable coupling agents are trialkoxysilanes which contain functional groups such as —OH, —NH$_2$, epoxy, or vinyl groups. Examples are trialkoxysilylglycidoxy- or -aminopropane, and trialkoxyvinyl- or -allylsilane. The alkoxy group can contain from 1 to 12 carbon atoms and can be, for example, methyl, ethyl, propyl, butyl, hexyl, octyl, or dodecyl.

Other conventional additions are—as a function of intended use—optical brighteners, pigments, dyes, wetting agents, or flow aids. For the curing of thick and pigmented coatings a suitable addition is glass microbeads or pulverized glass fibers, as described by way of example in U.S. Pat. No. 5,013,768.

It is particularly advantageous to add antisettling agents to increase the storage stability of the inventive flame-retardant resin formulation and to maintain processability. This avoids any settling of the fillers, including the flame retardant, and therefore avoids any need to redisperse them uniformly prior to processing. Amounts of from 0.09 to 4% by weight of the antisettling agent can be added, based on total filler content in the formulation. Examples of these antisettling agents are fine-particle silica, montmorillonite, Bentones, or xonolite.

The inventive flame-retardant resin formulation is prepared using processes which are per se conventional, via mixing of the components, preferably using high shear forces. It has proven advantageous to begin by dispersing the flame retardant and, if appropriate, other fillers in a suitable medium, for example in a solvent. Ketones such as acetone or methyl ethyl ketone are preferred, as also are mixtures of hydrocarbons, e.g. naphtha or petroleum ether.

Addition of a coupling agent can be helpful where appropriate. Dispersion times which are excessively long and often detrimental to light-sensitive substances are avoided when using the resulting pastes. These pastes can be prepared by way of example in ball mills, or on roll mills, or in high-speed dissolvers.

The inventive flame-retardant resin formulation can be applied uniformly to a substrate by means of known coating processes, e.g. by spincoating, dip coating, doctor coating, curtain coating, brushing, spraying, specifically via electrostatic spraying and reverse-roll coating. It is also possible to apply the photosensitive layer to a temporary, flexible carrier and then to coat the final substrate, e.g. a copper-coated printed circuit board, by using lamination for layer-transfer.

The amount applied (layer thickness) of the substrate (layer carrier) and its nature depend on the desired application sector. The layer thickness range generally encompasses values from about 0.1 μm to more than 50 μm.

The flexible printed circuit boards (substrate) are preferably uncoated or copper-coated plastics foils based on polyester, such as polyethylene terephthalate (PET) or polyethylene naphthalate.

After the coating of the substrates, particularly printed circuits, the solvent is removed with heating to generate tack-free layers for further processing in ovens, preferably at from 80-90° C.

The coated substrate is then exposed to light. The expression "imaging" exposure here includes not only exposure through a photomask which comprises a predetermined pattern, for example a photographic transparency, exposure using a laser beam which by way of example is computer-controlled so as to move across the surface of the coated substrate, thus producing an image, and also irradiation using computer-controlled electron beams.

After the imaging exposure of the material and prior to development, it can be advantageous to carry out a relatively brief thermal treatment. Here, only the parts exposed to light are thermally cured. The temperatures used are preferably from 50 to 150° C., particularly preferably from 80 to 130° C.; the thermal treatment time is generally from 0.25 to 100 minutes.

After exposure to light and, if appropriate, thermal treatment, the unexposed sites of the protective coating are removed in a manner known per se, using a developer.

The inventive flame-retardant resin formulation can be developed using aqueous alkali. Suitable aqueous-alkali developer solutions are particularly aqueous solutions of tetraalkylammonium hydroxides or of alkali metal silicates, of alkali metal phosphates, of alkali metal hydroxides, and of alkali metal carbonates. Relatively small amounts of wetting agents and/or of organic solvents may also have been added to these solutions. Examples of typical organic solvents of which small amounts can be added to the developer liquids are cyclohexanone, 2-ethoxyethanol, toluene, acetone, and also mixtures of these solvents.

The protective coating can then in turn be hardened at relatively high temperatures. A temperature>150° C. is preferred.

The printed or flexible circuits then obtained have a protective layer which comprises the inventive flame-retardant resin formulation, which meets the requirements placed upon it. There has been no impairment of electrical properties, and there has been substantial improvement in stability in soldering baths, indeed thus allowing a plurality of soldering bath cycles.

The physical properties of the products in the examples below were determined as follows. The results obtained are listed in Table I.

Combustibility

To produce the specimens, the solder resist was first applied by means of screenprinting on one side of a 200 mm×50 mm polyimide film thickness 25 μm (CAPTON™ 100 H, Toray-DuPont Co. Ltd.). After drying at 70° C., the solder resist was applied in the same way to the opposite side of the polyimide film. A conventional method was then used to expose the specimen to light after masking, this being followed by development and thermal curing.

Prior to the test, the specimen was conditioned for 48 h at 23° C. and at 50% relative humidity. The fire test was carried out to UL 94-VTM of Underwriters Laboratories Inc., U.S.A. (UL).

Tack

After application of the solder resist to a substrate and subsequent drying at 70° C., the specimen was cooled to room temperature and the tack of the coating surface was assessed on the following scale using finger contact:

A: Tack-free

B: Slight tack

C: Tack

Gray Level/Photosensitivity

For gray level determination, a film strip whose translucency decreased continually in a plurality of stage (21-stage Stouffer wedge) was placed on the solder resist. After the development process, the furthest stage susceptible to wash-off was found. The higher the gray level, the higher the photosensitivity.

Flexibility

A polyimide film coated with the flame-retardant solder resist was folded to 180° at a pressure of 0.5 MPa for 1 second. The orientation of the solder resist here was output. The specimen was then studied under an optical microscope for cracks in the solder resist:

A: No cracks in cured solder resist

C: Cracks in Solder Resist

Stability in Solder Baths

For simulation of the soldering process, the solder resist was coated with a flux (H-10F) after application to the copper-coated polyimide film. The specimen was then placed so as to float for 5 seconds in a soldering bath at 260° C. The cycle was repeated and prior to each repeat a check was made of visual alterations in the solder resist, e.g. blistering. The maximum number of cycles without alteration was noted.

PCT (Pressure Cooker Test)

The High-Pressure Cooker test can generally test the bond between the solder resist and the substrate. For this, in accordance with IPC-TM-650 2.6.16, test specimens of the copper-coated polyimide film coated with flame-retardant solder resist were placed in an autoclave to which a certain amount of water had previously been charged. The water was then brought to boiling point, thus generating an overpressure (0.2 MPa) in the autoclave. After 96 h of aging under these conditions, the test specimens were removed and conditioned at room temperature for 10 min. The specimens were then dipped for 20 seconds into a soldering bath whose temperature was 288° C. The specimens were then visually studied for delamination, exudation, and discoloration.

A: No delamination, discoloration, or exudation

B: Isolated delamination, discoloration, or exudation

C: Severe delamination, discoloration, and exudation

A light-sensitive resin formation was used for the studies.

The individual components of the coating were mixed with one another and then spread onto a substrate. When a dry-film solder resist was not used, the solvent was first removed by drying at relatively high temperatures. The coated substrate was then, if appropriate, exposed to light through an imaging mask and then developed by removal of the unhardened regions through washing with an aqueous alkaline solution. The protective layer obtained was then thermally cured by initiating crosslinking between the carboxylic acid and the epoxy component.

The invention is illustrated by the examples below.

INVENTIVE EXAMPLE 1

A solder resist was produced by mixing the following components:

| | |
|---|---|
| 40% by weight of | EA ® 6340 (epoxy acrylate (novolak type) having carboxylic acid groups, Shin-Nakamara Chemical Co., Ltd) |
| 5% by weight of | dipentaerythritol hexaacrylate (Aldrich Chemical Co.) |
| 10% by weight of | Epiclon ® N-695 (cresol novolak, Dainippon Ink & Chemicals Inc.) |
| 4% by weight of | IRGACURE ® 907 (initiator for photopolymerization, Ciba Geigy Corp.) |
| 0.5% by weight of | KAYACURE ® DETX-S (initiator for photopolymerization, Nippon Kayaku Co., Ltd.) |
| 5% by weight of | Aerosil ® 380 (silicon dioxide, Degussa) |
| 17% by weight of | barium sulfate (Sachtleben Bergbau GmbH) |
| 15% by weight of | aluminum diethylphosphinate |
| 0.5% by weight of | Hostaperm ® Blue A4R (phthalocyanine blue, Clariant Produkte Deutschland GmbH) |
| 1% by weight of | SWASOL ® 1500 (mixture of aromatic solvents, Cosmo Oil Co., Ltd.) |
| 1% by weight of | MODAFLOW ® (flow additive, MONSANTO COMPANY) |
| 1% by weight of | Curezol ® VT (2,4-diamino-6-vinyl-s-triazine, Shikoku Chemicals Corp.) |

A mixture corresponding to the respective constitution listed was prepared by repeated mixing on a three-roll mill. The mixture was then applied by means of screen printing to a substrate and dried at 70° C. for 30 minutes. The substrate used comprised
 a) a single-side-copper-coated polyimide film (UPISEL™ N, Ube Kosan Co., Ltd, thickness: 25 μm) or
 b) an uncoated polyimide film thickness of 25 μm (CAPTONE™ 100 H, Toray-DuPont Co., Ltd).

After application to the substrate, the solder resist was exposed to light through a mask, using a UV lamp (irradiation energy: 500 mJ/cm$^2$, emission maximum 365 nm). The unexposed regions were then removed using a 1% strength aqueous sodium carbonate solution. The solder resist itself was then in turn thermally postcured at 150° C. for 60 min.

INVENTIVE EXAMPLE 2

By analogy with inventive example 1, the following solder resist was prepared and tested. The aluminum diethylphosphinate was replaced by a flame-retardant mixture composed of aluminum diethylphosphinate and aluminum hydroxide:

| | |
|---|---|
| 30% by weight of | EA ® 6340 |
| 5% by weight of | dipentaerythritol hexaacrylate (Aldrich Chemical Co.) |
| 10% by weight of | Epiclon ® N-695 |
| 4% by weight of | IRGACURE ® 907 |
| 0.5% by weight of | KAYACURE ® DETX-S |
| 5% by weight of | Aerosil ® 380 |
| 17% by weight of | barium sulfate (Sachtleben Bergbau GmbH) |
| 10% by weight of | aluminum diethylphosphinate |
| 15% by weight of | aluminum hydroxide (HIGILITE ® H43M, Showa Denko K.K.) |
| 0.5% by weight of | Hostaperm ® Blue A4R |
| 1% by weight of | SWASOL ® 1500 |
| 1% by weight of | MODAFLOW ® |
| 1% by weight of | Curezol ® VT |

INVENTIVE EXAMPLE 3

By analogy with inventive example 1, the following solder resist was prepared and tested. The aluminum diethylphosphinate was replaced by a flame-retardant mixture composed of aluminum diethylphosphinate and melamine:

| | |
|---|---|
| 40% by weight of | EA ® 6340 |
| 5% by weight of | dipentaerythritol hexaacrytate (Aldrich Chemical Co.) |
| 10% by weight of | Epiclon ® N-695 |
| 4% by weight of | IRGACURE ® 907 |
| 0.5% by weight of | KAYACURE ® DETX-S |
| 5% by weight of | Aerosil ® 380 |
| 17% by weight of | barium sulfate (Sachtleben Bergbau GmbH) |
| 10% by weight of | aluminum diethylphosphinate |
| 5% by weight of | melamine (Melamine ® Grade 003, DSM, NL) |
| 0.5% by weight of | Hostaperm ® Blue A4R |
| 1% by weight of | SWASOL ® 1500 |
| 1% by weight of | MODAFLOW ® |
| 1% by weight of | Curezol ® VT |

INVENTIVE EXAMPLE 4

By analogy with inventive example 1, the following solder resist was prepared and tested. The aluminum diethylphosphinate was replaced by a flame-retardant mixture composed of aluminum diethylphosphinate and melamine cyanurate:

| | |
|---|---|
| 30% by weight of | EA ® 6340 |
| 5% by weight of | dipentaerythritol hexaacrylate (Aldrich Chemical Co.) |
| 10% by weight of | Epiclon ® N-695 |
| 4% by weight of | IRGACURE ® 907 |
| 0.5% by weight of | KAYACURE ® DETX-S |
| 5% by weight of | Aerosil ® 380 |
| 17% by weight of | barium sulfate (Sachtleben Bergbau GmbH) |
| 10% by weight of | aluminum diethylphosphinate |
| 10% by weight of | melamine cyanurate (DSM, NL) |
| 0.5% by weight of | Hostaperm ® Blue A4R |
| 1% by weight of | SWASOL ® 1500 |
| 1% by weight of | MODAFLOW ® |
| 1% by weight of | Curezol ® VT |

INVENTIVE EXAMPLE 5

By analogy with inventive example 1, the following solder resist was prepared and tested. The aluminum diethylphosphinate was replaced by a flame-retardant mixture composed of aluminum diethylphosphinate and melamine phosphate:

| | |
|---|---|
| 30% by weight of | EA ® 6340 |
| 5% by weight of | dipentaerythritol hexaacrylate (Aldrich Chemical Co.) |
| 10% by weight of | Epiclon ® N-695 |
| 4% by weight of | IRGACURE ® 907 |
| 0.5% by weight of | KAYACURE ® DETX-S |
| 5% by weight of | Aerosil ® 380 |
| 17% by weight of | barium sulfate (Sachtleben Bergbau GmbH) |
| 10% by weight of | aluminum diethylphosphinate |
| 10% by weight of | melamine phosphate (DSM, NL) |
| 0.5% by weight of | Hostaperm ® Blue A4R |
| 1% by weight of | SWASOL ® 1500 |
| 1% by weight of | MODAFLOW ® |
| 1% by weight of | Curezol ® VT |

INVENTIVE EXAMPLE 6

By analogy with inventive example 1, the following solder resist was prepared and tested. The aluminum diethylphosphinate was replaced by a flame-retardant mixture composed of aluminum diethylphosphinate and melamine and zinc borate:

| | | |
|---|---|---|
| 30% | by weight of | EA ® 6340 |
| 5% | by weight of | dipentaerythritol hexaacrylate (Aldrich Chemical Co.) |
| 10% | by weight of | Epiclon ® N-695 |
| 4% | by weight of | IRGACURE ® 907 |
| 0.5% | by weight of | KAYACURE ® DETX-S |
| 5% | by weight of | Aerosil ® 380 |
| 17% | by weight of | barium sulfate (Sachtleben Bergbau GmbH) |
| 7% | by weight of | aluminum diethylphosphinate |
| 10% | by weight of | melamine (DSM, NL) |
| 3% | by weight of | zinc borate (Firebrake ® ZB, U.S. Borax & Chemical Corporation, USA) |
| 0.5% | by weight of | Hostaperm ® Blue A4R |
| 1% | by weight of | SWASOL ® 1500 |
| 1% | by weight of | MODAFLOW ® |
| 1% | by weight of | Curezol ® VT |

COMPARATIVE EXAMPLE 1

By analogy with inventive example 1, the following solder resist was prepared and tested for comparison. Instead of the aluminum diethylphosphinate, a commercially available phosphoric ester was used as flame retardant:

| | | |
|---|---|---|
| 40% | by weight of | EA ® 6340 |
| 5% | by weight of | dipentaerythritol hexaacrylate (Aldrich Chemical Co.) |
| 10% | by weight of | Epiclon ® N-695 |
| 4% | by weight of | IRGACURE ® 907 |
| 0.5% | by weight of | KAYACURE ® DETX-S |
| 5% | by weight of | Aerosil ® 380 |
| 17% | by weight of | barium sulfate (Sachtleben Bergbau GmbH) |
| 15% | by weight of | PX ® 200 (aromatic phosphoric ester, Daihachi Chemical Industry Co., Ltd) |
| 0.5% | by weight of | Hostaperm ® Blue A4R |
| 1% | by weight of | SWASOL ® 1500 |
| 1% | by weight of | MODAFLOW ® |
| 1% | by weight of | Curezol ® VT |

COMPARATIVE EXAMPLE 2

By analogy with inventive example 1, the following solder resist was prepared and tested for comparison. Instead of the aluminum diethylphosphinate, a commercially available brominated epoxy resin was used as flame retardant:

| | | |
|---|---|---|
| 40% | by weight of | EA ® 6340 |
| 5% | by weight of | dipentaerythritol hexaacrylate (Aldrich Chemical Co.) |
| 10% | by weight of | Epiclon ® N-695 |
| 4% | by weight of | IRGACURE ® 907 |
| 0.5% | by weight of | KAYACURE ® DETX-S |
| 5% | by weight of | Aerosil ® 380 |
| 17% | by weight of | barium sulfate (Sachtleben Bergbau GmbH) |
| 20% | by weight of | EPIKOTE ® 5051 (brominated epoxy resin, Japan Epoxy Resins Co., Ltd) |
| 0.5% | by weight of | Hostaperm ® Blue A4R |
| 1% | by weight of | SWASOL ® 1500 |
| 1% | by weight of | MODAFLOW ® |
| 1% | by weight of | Curezol ® VT |

The solder resist produced using the inventive resin formulation has excellent flexibility, and good adhesion and insulation properties, and also very good flame retardancy, and excellent stability in solder baths, stability with respect to moisture, and stability with respect to temperature (Table 1). The inventive flame-retardant resin formulations can be used as protective coating for both rigid and flexible printed circuit boards.

In particular, the solder resist produced using the inventive resin formation and therefore modified by aluminum diethylphosphinate, for rigid and flexible printed circuit boards, can be crosslinked by irradiation. The flame-retardant solder resist produced using the inventive resin formulation exhibits very good stability in solder baths, while no exudation, discoloration, or delamination was observed. The degree of crosslinking, and the adhesion, of the flame-retardant solder resist produced using the inventive resin formulation is very good on all substrates conventional in the printed circuit board industry, in particular on copper, lead/tin, and also epoxy resin and polyimide. The solder resist produced using the inventive resin formation and therefore modified by aluminum diethylphosphinate can, after exposure, be developed easily and in an especially environmentally compatible manner using alkaline aqueous solutions. The cured solder resist is not brittle, but instead exhibits excellent flexibility, and this is of particularly great interest for application in a flexible printed circuit board.

The solder resist produced using the inventive resin formation and therefore modified by aluminum diethylphosphinate is halogen-free and exhibits excellent fire performance. UL 94 VTM-0 classification is achieved even when the amounts added are relatively small.

TABLE 1

| | Physical properties | | | | | | | |
|---|---|---|---|---|---|---|---|---|
| | Inventive example 1 | Inventive example 2 | Inventive example 3 | Inventive example 4 | Inventive example 5 | Inventive example 6 | Comparative example 1 | Comparative example 2 |
| Layer thickness (μm) | 25 | 25 | 25 | 25 | 25 | 25 | 25 | 25 |
| Combustibility (UL 94) | VTM-0 | VTM-0 | VTM-0 | VTM-0 | VTM-0 | VTM-0 | VTM-1 | VTM-0 |
| Tack | A | A | A | A | A | B | C | C |
| Gray metal/photosensitivity | 8 | 8 | 8 | 8 | 8 | 7 | 7 | 8 |

TABLE 1-continued

| Physical properties | Inventive example 1 | Inventive example 2 | Inventive example 3 | Inventive example 4 | Inventive example 5 | Inventive example 6 | Comparative example 1 | Comparative example 2 |
|---|---|---|---|---|---|---|---|---|
| Flexibility | A | A | A | A | A | A | A | C |
| Stability in solvent baths | 4 | 3 | 3 | 3 | 3 | 3 | 2 | 4 |
| PCT | A | A | A | A | B | A | C | C |

The invention claimed is:

1. A flame-retardant resin formulation comprising
from 5 to 20% by weight of a flame retardant component,
from 30 to 40% by weight of an alkali-soluble component,
from 5 to 10% by weight of a polymerizable monomer,
from 4 to 5% by weight of a photoinitiator, and
from 5 to 10% by weight of epoxy component,
wherein the flame-retardant component is a phosphinic salt of the formula (I)

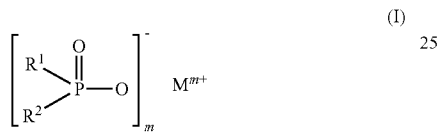

wherein the phosphinic salt of the formula (I) is the aluminum salt of diethylphosphinic acid, wherein the median particle size ($d_{50}$) of the aluminum salt of diethylphosphinic acid is from 0.1 to 100 µm, wherein the alkali-soluble component is a modified epoxy acrylate, wherein the polymerizable monomer is a polyfunctional acrylate of polyhydric alcohols, wherein the polyhydric alcohols are pentaerythritol, dipentaerythritol or a mixture thereof, wherein the photoinitiator is an alpha-aminoacetophenone and wherein the epoxy compound is an epoxidized novolak.

2. The flame-retardant resin formulation as claimed in claim 1, wherein the alpha-aminoacetophenone is (4-methylthiobenzoyl)-1-methyl-1-morpholinoethane.

3. The flame-retardant resin formulation as claimed in claim 1, further comprising 0.1 to 30% by weight, of at least one synergistic flame-retardant component, wherein the at least one synergistic flame-retardant component is melamine, melamine derivatives of cyanuric acid, melamine derivatives of isocyanuric acid, melamine salts, melamine phosphate, melamine polyphosphate, melamine diphosphate, dicyandiamide, a guanidine compound, guanidine carbonate, guanidine phosphate, guanidine sulfate, condensates of ethyleneurea and formaldehyde, ammonium polyphosphate; oxygen compounds of silicon, orthosalicic acid and its condensates, silicates, zeolites, silicas or aluminum hydroxide.

4. A coating for electronics and electrical engineering comprising a flame-retardant formulation, wherein the flame-retardant resin formulation comprises
from 5 to 20% by weight of a flame retardant component,
from 30 to 40% by weight of an alkali-soluble component,
from 5 to 10% by weight of a polymerizable monomer,
from 4 to 5% by weight of a photoinitiator, and
from 5 to 10% by weight of epoxy component,
wherein the flame-retardant component is a phosphinic salt of the formula (I)

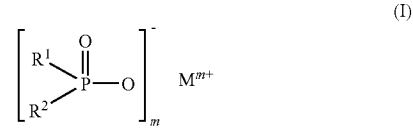

wherein the phosphinic salt of the formula (I) is the aluminum salt of diethylphosphinic acid, wherein the median particle size ($d_{50}$) of the aluminum salt of diethylphosphinic acid is from 0.1 to 100 µm, wherein the alkali-soluble component is a modified epoxy acrylate, wherein the polymerizable monomer is a polyfunctional acrylate of polyhydric alcohols, wherein the polyhydric alcohols are pentaerythritol, dipentaerythritol or a mixture thereof, wherein the photoinitiator is an alpha-aminoacetophenone and wherein the epoxy compound is an epoxidized novolak.

5. A flame-retardant solder resist comprising a flame-retardant formulation, wherein the flame-retardant resin formulation comprises
from 5 to 20% by weight of a flame retardant component,
from 30 to 40% by weight of an alkali-soluble component,
from 5 to 10% by weight of a polymerizable monomer,
from 4 to 5% by weight of a photoinitiator, and
from 5 to 10% by weight of epoxy component,
wherein the flame-retardant component is a phosphinic salt of the formula (I)

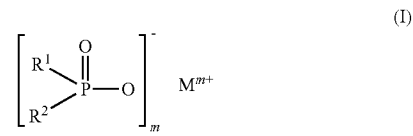

wherein the phosphinic salt of the formula (I) is the aluminum salt of diethylphosphinic acid, wherein the median particle size ($d_{50}$) of the aluminum salt of diethylphosphinic acid is from 0.1 to 100 µm, wherein the alkali-soluble component is a modified epoxy acrylate, wherein the polymerizable monomer is a polyfunctional acrylate of polyhydric alcohols, wherein the polyhydric alcohols are pentaerythritol, dipentaerythritol or a mixture thereof, wherein the photoinitiator is an alpha-aminoacetophenone and wherein the epoxy compound is an epoxidized novolak.

6. A process for the production of the flame-retardant solder resist as claimed in claim 5, comprising the steps of using spincoating, dip coating, doctor coating, curtain coating, brushing, spraying, or reverse roll coating to apply a thin layer of the solder resist to a substrate, drying and exposing the thin layer of the solder resist to light, developing the thin layer of the solder resist with an alkaline solution, and thermally post-curing the thin layer of the solder resist.

7. The process as claimed in claim 6, wherein the substrate is a rigid or flexible printed circuit board.

8. The process as claimed in claim 6, wherein the flexible printed circuit board is an uncoated or copper-coated plastics polymer based on polyester, polyimide, epoxy resin reinforced with aramide fibers, or Liquid Crystal Polymer (LCP).

9. The process as claimed in claim 6, wherein the layer thickness of the thin layer of the solder resist is from 0.1 to 50 μm.

10. The flame-retardant resin formulation as claimed in claim 1, wherein the median particle size ($d_{50}$) of the aluminum salt of diethylphosphinic acid is from 1 to 20 μm.

11. The flame-retardant resin formulation as claimed in claim 1, further comprising 1 to 20% by weight, of at least one synergistic flame-retardant component, wherein the at least one synergistic flame-retardant component is melamine, melamine derivatives of cyanuric acid, melamine derivatives of isocyanuric acid, melamine salts, melamine phosphate, melamine polyphosphate, melamine diphosphate, dicyandiamide, a guanidine compound, guanidine carbonate, guanidine phosphate, guanidine sulfate, condensates of ethyleneurea and formaldehyde, ammonium polyphosphate; oxygen compounds of silicon, orthosalicic acid and its condensates, silicates, zeolites, silicas or aluminum hydroxide.

* * * * *